(12) United States Patent
Eisenmenger

(10) Patent No.: US 9,915,872 B2
(45) Date of Patent: Mar. 13, 2018

(54) OPTICAL COMPONENT

(71) Applicant: Carl Zeiss SMT GmbH, Oberkochen (DE)

(72) Inventor: Johannes Eisenmenger, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 83 days.

(21) Appl. No.: 14/978,078

(22) Filed: Dec. 22, 2015

(65) Prior Publication Data

US 2016/0109807 A1    Apr. 21, 2016

Related U.S. Application Data

(63) Continuation of application No. PCT/EP2014/064468, filed on Jul. 7, 2014.

(30) Foreign Application Priority Data

Jul. 16, 2013  (DE) .................. 10 2013 213 842

(51) Int. Cl.
*G03B 27/52* (2006.01)
*G03B 27/42* (2006.01)
(Continued)

(52) U.S. Cl.
CPC ............ *G03F 7/7015* (2013.01); *G02B 7/006* (2013.01); *G02B 7/008* (2013.01); *G02B 17/0892* (2013.01); *G02B 26/0833* (2013.01); *G03F 7/70075* (2013.01); *G03F 7/70116* (2013.01); *G03F 7/70825* (2013.01); *G03F 7/70891* (2013.01)

(58) Field of Classification Search
CPC .... G02B 26/0833; G02B 7/006; G02B 7/008; G02B 26/085; G02B 27/0025; G02B 7/1815; G02B 26/0825; G02B 26/0866; G02B 27/10; G02B 6/29304; G02B 7/00; G03F 7/7015; G03F 1/22; G03F 1/20; G03F 7/70875; G03F 7/70075; G03F 7/70191; G03F 7/70825
See application file for complete search history.

(56) References Cited

U.S. PATENT DOCUMENTS 4,775,797 A   10/1988   Stengl et al.
4,855,197 A   8/1989    Zapka et al.
(Continued)

FOREIGN PATENT DOCUMENTS

DE   10 2010 040 108 A1   3/2012
EP       0 222 737 A2     5/1987
(Continued)

OTHER PUBLICATIONS

Chinese office action with English translation with respect to CN App. Ser. No. 2014 8004 5507.7, dated Dec. 30, 2016, 19 pages.
(Continued)

*Primary Examiner* — Mesfin Asfaw
(74) *Attorney, Agent, or Firm* — Fish & Richardson P.C.

(57) ABSTRACT

The disclosure provides an optical component that includes an optical element fixed in the transverse direction in a frame. The frame has a linear expansion of at most 0.01% in the transverse direction even in the case of a linear expansion of the optical element in the transverse direction by up to 1%.

22 Claims, 6 Drawing Sheets

(51) Int. Cl.
    *G03F 7/20*     (2006.01)
    *G02B 26/08*    (2006.01)
    *G02B 17/08*    (2006.01)
    *G02B 7/00*     (2006.01)

(56)              References Cited

U.S. PATENT DOCUMENTS

2003/0043455 A1    3/2003   Singer et al.
2007/0015067 A1    1/2007   Amemiya
2011/0309271 A1    12/2011  Moriya et al.
2014/0211187 A1    7/2014   Hauf et al.

FOREIGN PATENT DOCUMENTS

EP          0 244 496 A1      11/1987
EP          1 225 481 A2      7/2002
WO      WO 2006/069725 A1     7/2006
WO      WO 2010/049076 A2     5/2010
WO      WO 2012/028303 A1     3/2012

OTHER PUBLICATIONS

International Search Report and Written Opinion for corresponding PCT Appl No. PCT/EP2014/064468, dated Dec. 11, 2014.
Li Y et al. "Pattern density dependence of thermal deformation of extreme ultraviolet mask and its impact on full field lithography performance," Japanese Journal of Appl Physics, vol. 46, No. 8A, Aug. 1, 2007, 5104-5111.
German Office Action, with translation thereof, for corresponding DE Appl No. 10 2013 213 842.3, dated Feb. 13, 2014.

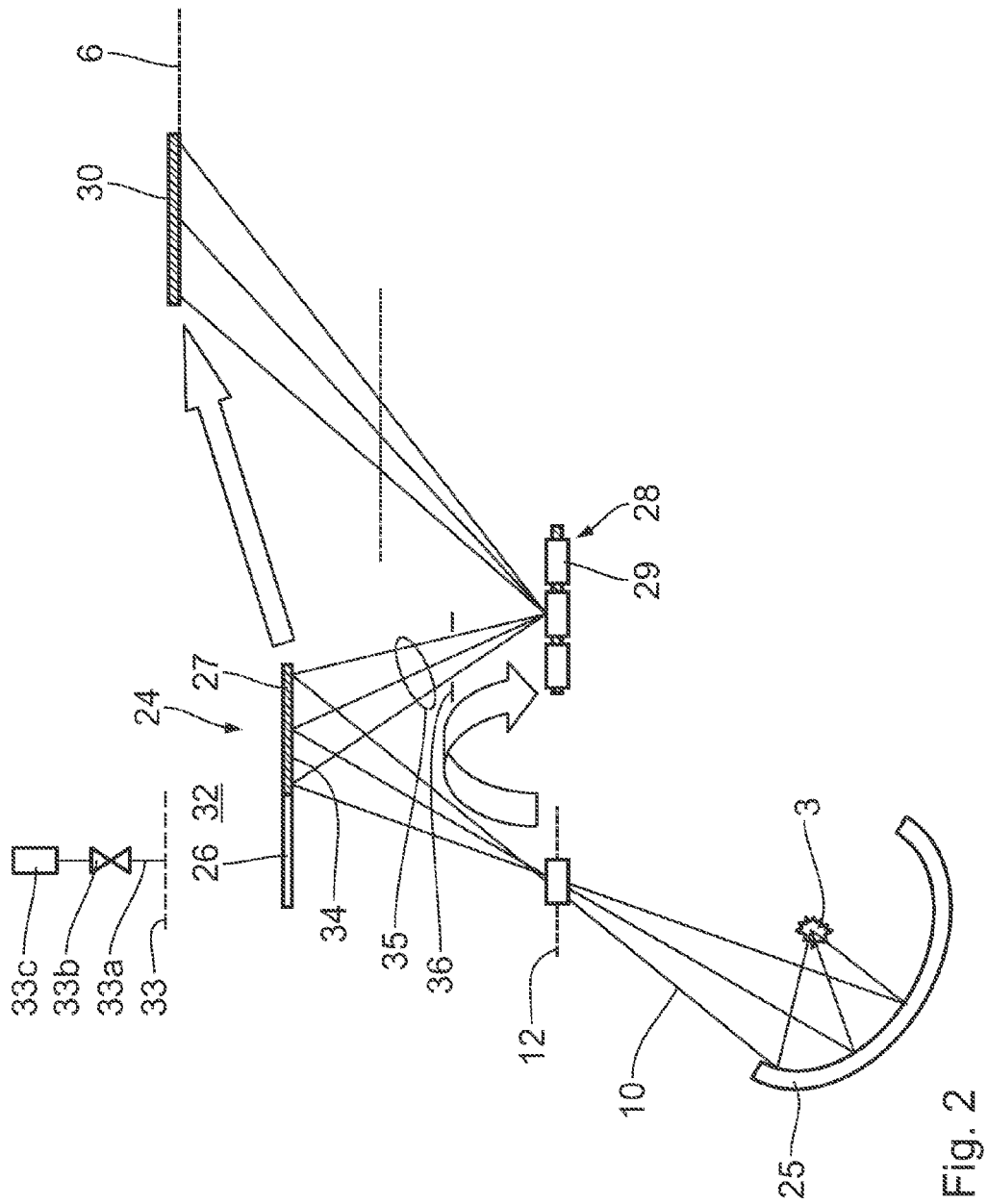

OPTICAL COMPONENT

CROSS-REFERENCE TO RELATED APPLICATIONS

The present application is a continuation of, and claims benefit under 35 USC 120 to, international application PCT/EP2014/064468, filed Jul. 7, 2014, which claims benefit under 35 USC 119 of German Application No. 10 2013 213 842.3, filed Jul. 16, 2013. The entire disclosure of international application PCT/EP2014/064468 is incorporated by reference herein.

FIELD

The disclosure relates to an optical component and an optical assembly including such a component. Moreover, the disclosure relates to an illumination optical unit and an illumination system for a projection exposure apparatus, and a projection exposure apparatus including such an optical assembly. Further, the disclosure relates to a method for producing a micro- or nanostructured component.

BACKGROUND

When optical components are used, their arrangement in the beam path can be of great importance. In this case, it is possible to differentiate between a positioning in the direction of the beam path and a position perpendicular thereto. Depending on the application, one or the other or both of these positions may be of great importance.

By way of example, for the arrangement of filters and/or stops, the precise positioning thereof in the direction perpendicular to the beam path is often of great importance.

An obscuration stop is known for example from WO 2006/069 725 A1 and DE 10 2010 040 108 A1.

SUMMARY

The disclosure seeks to improve an optical component, in particular an obscuration stop.

In one aspect, the disclosure provides an optical component for the targeted obscuration of individual micromirrors of a micromirror array. The optical component includes at least one optical element extending transversely with respect to a first direction. The optical component also includes a frame for mounting the optical element. The optical element is freely accessible in a central region in the direction of the first direction. The optical element, at at least two locations situated opposite one another relative to a transverse direction oriented perpendicularly to the first direction, is fixed by the frame in the transverse direction. The frame is embodied in such a way that it has a linear expansion of at most 0.01% in the transverse direction even in the case of a linear expansion of the optical element in the transverse direction by up to 1%.

The essence of the disclosure consists in arranging an optical element, in particular an obscuration stop, in a frame in such a way that it is freely accessible in a first direction and is fixed at least regionally, in particular marginally, in a direction perpendicular thereto. The fixing of the optical element via the frame reduces or limits the maximum shifting, i.e. displacement, thereof in a direction perpendicular to the first direction in the case of a possible expansion, in particular a thermal expansion. The fixing in the frame makes it possible, in particular, to achieve the effect that the projection of the position vectors of the optical element along the first direction onto a plane does not experience at any location a local shift greater than one quarter of the maximum change in length that is experienced by the optical element. In this case, the maximum change in length is measured along the surface of the optical element which, particularly in the case of an expansion of the optical element, can be embodied as non-planar, i.e. non-plane, in particular curved.

The optical element is arranged in the frame in particular in such a way that it is freely accessible in a first direction, fixed at least regionally, in particular marginally, in a second direction perpendicular thereto, and freely movable, in particular not fixed in the frame, in a third direction, which runs perpendicular to the first and second directions.

The optical element is fixed by a frame, in particular, wherein the frame is embodied in such a way that it has a linear expansion of at most 0.01%, in particular at most 0.001%, in particular at most 0.0001%, in the transverse direction, i.e. perpendicular to the first direction, even in the case of a linear expansion of the optical element in the transverse direction by up to 1%. In other words, the frame is stiffer, in particular more resistant to deformation, than the optical element. The frame is mechanically very stable as a result. It is mechanically stable in particular relative to the optical element. It is preferably substantially non-deformable. The frame thus fixedly predefines the position of the optical element in the transverse direction at least at the fixing locations. The optical element is arranged on or in the frame in particular in such a way that it can bulge or bend out in the case of a possible linear expansion. Particularly the central region of the optical element can move, in particular bend out or bulge, in the first direction or oppositely thereto. The optical element can be, in particular a membrane or a membranelike or platelike element. The optical component is, in particular, an obscuration stop. It can be in particular a filter, in particular a blockade filter. Such a thin embodiment of the optical element increases the flexibility thereof. The optical element is chosen in particular in such a way, in particular so thin, that it can bulge or bend out in the first direction or oppositely thereto.

The optical element is in particular a filter, in particular a phase and/or amplitude filter. It can also be spectral filter. It can be a blockade filter, in particular. Such a filter is also referred to as obscuration or obscuration stop. The optical element can also be a diffractive element or an element having diffractive properties.

In accordance with one aspect of the disclosure, the optical element is embodied as a phase and/or intensity filter.

The optical element has in the first direction in particular a thickness of at most 1 mm, in particular at most 500 µm, in particular at most 200 µm, in particular at most 100 µm, in particular at most 50 µm, in particular at most 20 µm, in particular at most 10 µm, in particular at most 1 µm, in particular at most 100 nm, in particular at most 10 nm, in particular at most 5 nm.

The optical element has a high heat resistance. It is heat-resistant in particular up to temperatures of at least 30° C., in particular at least 100° C., in particular at least 300° C., in particular at least 500° C., in particular at least 1000° C.

The optical element preferably includes a material having a thermal conductivity of at least 10 W/(mK), in particular of at least 30 W/(mK), in particular of at least 100 W/(mK), in particular of at least 200 W/(mK), in particular of at least 300 W/(mK). These indications relate to a temperature of 0° C. A high thermal conductivity improves the heat dissipation from the optical element to the frame. The frame can form in particular a heat sink for the optical element.

Conversely, for the production of the optical element, in particular, it may be advantageous to produce the optical element from a material having a low thermal conductivity. Particularly in the case of production via a laser method, the precision of the optical element can be improved as a result. The optical element can include in particular a material having a thermal conductivity of at most 1000 W/(mk), in particular of at most 300 W/(mK), in particular of at most 200 W/(mK), or can consist of such a material. The optical element can be produced in particular from one or a plurality of such materials. It can consist in particular of one or a plurality of such materials. It can also include a carrier composed of one or a plurality of such materials. Possible materials for the optical element are, for example, copper, aluminum, silicon, silicon nitride, silicon carbide and diamond. A high thermal conductivity has the effect that the optical element can emit heat particularly efficiency to the frame which in other words acts as a heat sink. Excessive heating of the optical element is avoided as a result.

Preferably, the optical element is composed of a material having a low coefficient of linear expansion. The precision of the arrangement of the optical element, particularly in the transverse direction, is increased as a result.

According to the disclosure, it has been recognized that an obscuration element, such as a blockade filter, for example, can heat up on account of the absorption of used radiation. The heating can lead to a linear expansion of the element. An undesired shift of the optical element in a direction perpendicular to the direction of propagation of the used radiation can occur on account of the linear expansion. According to the disclosure, it has furthermore been recognized that the possible shift in the transverse direction, i.e. perpendicular to the direction of propagation of the used radiation, can be significantly reduced by the optical element being clamped into a stable frame at two mutually opposite sides. Preferably, the frame is embodied in a circumferentially extending fashion, in particular in a closed fashion. The optical element is fixed by the frame in particularly marginally, in particular in a circumferentially extending, in particular closed, region.

In accordance with one aspect of the disclosure, the frame is so stable that it cannot deform, in particular cannot warp, as a result of thermal stresses of the optical element, in particular as a result of the thermal expansion thereof. The precision of the arrangement of the optical element is increased as a result.

In accordance with one aspect of the disclosure, the optical element is fixed by the frame in a direction perpendicular to the first direction in a region extending circumferentially around the central region. Consequently, the position of the circumferentially extending region is fixed in a direction perpendicular to the first direction. The optical element can thus be arranged in a beam path precisely in a direction perpendicular to the first direction with the aid of the frame.

In accordance with a further aspect of the disclosure, the optical component is fixed via clamping, adhesive bonding, magnetic or electrostatic forces. It can be fixed to a mounting frame in particular in an exchangeable manner. This firstly increases the flexibility in the choice of a suitable optical element; secondly, it enables simple repair of the optical component, in particular by exchange of the obscuration element, and the precise arrangement thereof in an optical system.

In accordance with a further aspect of the disclosure, the optical element has radiation-nontransmissive regions. The optical element can also have radiation-transmissive regions. The optical element can be embodied in a grating-like fashion or include a gratinglike structure.

The grating can be embodied in particular as a crossed grating, i.e. as a grating having crossed grating webs and intervening grating meshes. The grating meshes can form radiation-nontransmissive regions. Meshes cut out in particular can form radiation-transmissive regions. It is possible, in particular, to cut out the grating from a planar structure, in particular a metal plate or film or a corresponding substrate. A laser method, in particular, can be provided for producing the grating, in particular for cutting out the meshes.

The optical element can be embodied in a self-supporting fashion. The optical element can be arranged on a carrier or include a carrier.

In accordance with one aspect of the disclosure, the optical element includes an at least regionally radiation-transmissive carrier, on which the radiation-nontransmissive regions are arranged. The flexibility of the structural design of the optical element is increased by the arrangement of the radiation-nontransmissive regions on a carrier. The radiation-nontransmissive regions can be composed, in particular, of a different material from the carrier.

In accordance with one aspect of the disclosure, a glass plate, in particular a structured glass plate, or a grating, in particular a metal, semiconductor or ceramic grating, serves as the carrier. The grating described above can thus itself form the optical element or serve as a carrier for the latter.

In accordance with a further aspect of the disclosure, the grating has webs having a width in the range of 1 μm to 100 μm, in particular in the range of 3 μm to 30 μm, in particular in the range of 5 μm to 20 μm.

The optical element can be embodied in a plane fashion in the basic state, in particular under normal conditions. It can also be embodied in a bent fashion. It can have in particular a pre-bend in the direction of the first direction, i.e. in the direction perpendicular to the plane defined by the frame.

Moreover, it may be advantageous to provide the optical element with predetermined bending locations.

In accordance with a further aspect of the disclosure, the frame has along the first direction a thickness which is at least 10 times the magnitude of that of the optical element. The frame can have in particular a thickness along the first direction which is at least 20 times, in particular at least 50 times, in particular at least 100 times, in particular at least 1000 times, the magnitude of that of the optical element. The frame is very stable as a result. It is very stable in particular relative to the optical element. It is non-deformable to the greatest possible extent in particular relative to the optical element. It is in particular stable enough that it cannot warp as a result of thermal stresses of the filter.

In accordance with a further aspect of the disclosure, the frame is thermally coupled to a cooling device. It is coupled in particular to a heat sink. The thermal coupling can be produced in particular via a solid-state connection, a gas interface or a liquid interface. In other words, the frame can be actively cooled. A thermal expansion of the frame can be reduced, in particular avoided, as a result.

In accordance with a further aspect of the disclosure, the frame has a heat capacity which is at least 10 times the magnitude of that of the optical element. The heat capacity of the frame is in particular at least 100 times the magnitude, in particular at least 1000 times the magnitude, of that of the optical element. It is thereby possible to ensure that heating of the optical element leads at most to negligibly little heating of the frame. In other words, the frame can itself constitute a heat sink for the optical element.

In accordance with a further aspect of the disclosure, the frame includes a material having a thermal conductivity of at least 100 W/(mK). The frame includes in particular a material having a thermal conductivity of at least 200 W/(mK), in particular at least 300 W/(mK). These indications relate to a temperature of 0° C. The frame can be produced in particular from one or a plurality of such materials. It preferably consists of one or a plurality of such materials. In particular copper, aluminum, diamond and silicon carbide are appropriate as materials for the frame.

Preferably, the frame is composed of a material having a low coefficient of linear expansion. The frame itself has in particular a low thermal expansion. This can also be achieved by a combination of suitable materials.

In one aspect, the disclosure provides an optical assembly that includes a micromirror array having a multiplicity of micromirrors. The optical assembly also includes an optical component according to the disclosure. Each of the radiation-nontransmissive regions is assigned in each case to one micromirror or a plurality of micromirrors adjacent to one another.

The optical assembly includes in particular a micromirror array having a multiplicity of micromirrors and an optical component according to the description above.

The micromirror array can be in particular a facet mirror, in particular for a projection exposure apparatus, in particular for a UV projection exposure apparatus, DUV projection exposure apparatus, VUV projection exposure apparatus or an EUV projection exposure apparatus. The micromirror array is in particular embodied as a microoptoelectromechanical system (MOEMS). Individual illumination rays can be individually deflected via such an MOEMS having a multiplicity of micromirrors. Light beams having individual light rays can be provided for illumination purposes. With the aid of the optical component, it is possible to influence which of the micromirrors can be illuminated by a predefined radiation source and/or a further micromirror array. With the aid of the optical component, it is possible, in particular, to stop down, i.e. to obscure, individual micromirrors of the micromirror array in a targeted manner.

In accordance with one aspect of the disclosure, exactly one micromirror is assigned to each of the radiation-non-transmissive regions of the optical element. It is also possible to embody one or a plurality of the radiation-nontransmissive regions in such a way that they are assigned to two or more micromirrors adjacent to one another.

Further aspects of the disclosure provide an illumination optical unit for a projection exposure apparatus, an illumination system for a projection exposure apparatus, and a projection exposure apparatus. The advantages are evident from those described above with regard to the optical component.

A further aspect of the disclosure seeks to improve a method for producing a micro- or nanostructured component. The advantages are evident from those described above.

With the use of an illumination system including a UV radiation source, a DUV radiation source having a generated used radiation in the range of approximately 200 nm to 300 nm, in particular for example 248 nm, a VUV radiation source having a generated used radiation in the range of approximately 100 nm to 200 nm, in particular for example of 193 nm, or including an EUV radiation source having a generated used radiation in the range of 5 nm to 30 nm, the advantages of the optical component according to the disclosure are manifested particularly well.

BRIEF DESCRIPTION OF THE DRAWINGS

Exemplary embodiments of the disclosure are explained in more detail below with reference to the drawings. In the figures:

FIG. 2 shows a further embodiment of an illumination optical unit of the projection exposure apparatus according to FIG. 1 comprising a micromirror array (MMA) and a pupil facet mirror illuminated by the latter;

FIG. 3 schematically shows a plan view of the pupil facet mirror according to FIG. 2 with a pupil facet illumination which corresponds to an illumination setting;

DETAILED DESCRIPTION

Figure 1:
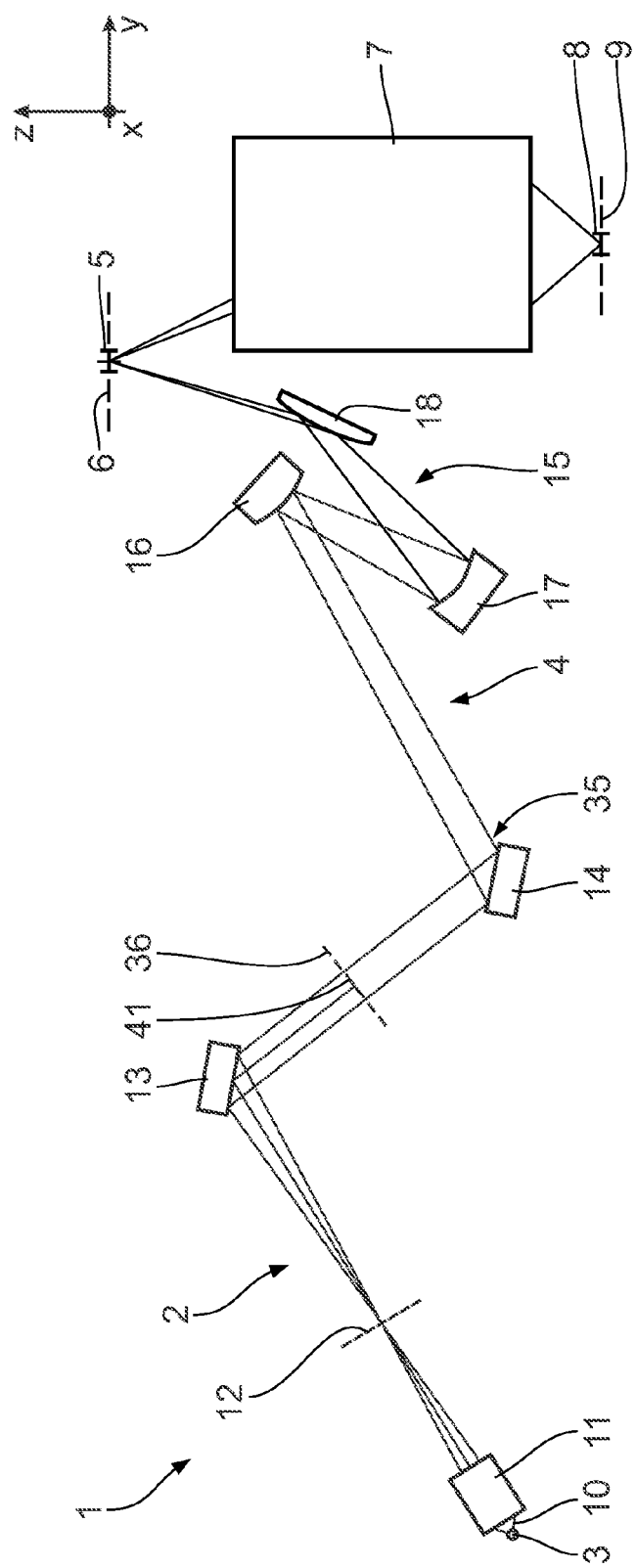
FIG. 1 schematically shows a projection exposure apparatus for microlithography comprising an illumination optical unit illustrated in meridional section and a projection optical unit

Firstly, the general construction of a projection exposure apparatus 1 and the constituent parts thereof will be described. For details in this regard, reference should be made to WO 2010/049076 A2, which is hereby fully incorporated in the present application as part thereof. FIG. 1 schematically shows a projection exposure apparatus 1 for microlithography in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of micro- or nanostructured semiconductor components. A projection optical unit 7 serves for imaging the object field 5 into an image field 8 in an image plane 9. The structure on the reticle is imaged onto a light-sensitive layer of a substrate, in particular in the form of a wafer, which is not illustrated in the drawing, the substrate being arranged in the region of the image field 8 in the image plane 9. The exposed light-sensitive layer is subsequently developed.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

The radiation source 3 can also be a UV radiation source, a DUV radiation source having a generated used radiation in the range of approximately 200 nm to 300 nm, in particular for example of 248 nm, or a VUV radiation source having an emitted used radiation in the range of between 100 nm and 200 nm, in particular of 193 nm.

Radiation 10 which emerges from the radiation source 3 is focused by a collector 11. A corresponding collector is known for example from EP 1 225 481 A. Downstream of the collector 11, the radiation 10 propagates through an intermediate focal plane 12 before impinging on a field facet mirror 13. The free facet mirror 13 is arranged in a plane of the illumination optical unit 4 that is optically conjugate with respect to the object plane 6.

The radiation 10 is also referred to hereinafter as used radiation, illumination light or as imaging light.

Downstream of the field facet mirror 13, the radiation 10 is reflected by a pupil facet mirror 14. The pupil facet mirror 14 lies either in the entrance pupil plane of the illumination optical unit 7 or in an optically conjugate plane with respect thereto. The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets which illuminate the entire object field 5 by themselves is represented by exactly one of the individual mirrors. Alternatively, it is possible to construct at least some or all of the field facets using a plurality of such individual mirrors. The same correspondingly applies to the configuration of the pupil facets of the pupil facet mirror 14, which are respectively assigned to the field facets and which can be formed in each case by a single individual mirror or by a plurality of such individual mirrors.

The field facets split the radiation 10 incident from the radiation source 3 into a multiplicity of beams 35. The beams 35 generate secondary light sources near or at the location of the pupil facets.

The radiation 10 impinges on the two facet mirrors 13, 14 at an angle of incidence that is less than or equal to 25°. The radiation 10 therefore impinges on the two facet mirrors in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the radiation 10, the field facets of the field facet mirror 13 are imaged into the object field 5 in a manner being superimposed on one another. The last mirror 18 of the transfer optical unit 15 is a grazing incidence mirror. The transfer optical unit 15 together with the pupil facet mirror 14 is also referred to as a sequential optical unit for transferring the radiation 10 from the field facet mirror 13 towards the object field 5. The illumination light 10 is guided from the radiation source 3 towards the object field 5 via a plurality of illumination channels. Each of these illumination channels is assigned a field facet of the field facet mirror 13 and a pupil facet of the pupil facet mirror 14, the pupil facet being disposed downstream of the field facet. The individual mirrors of the field facet mirror 13 and of the pupil facet mirror 14 can be tiltable by an actuator system, such that a change in the assignment of the pupil facets to the field facets and correspondingly a changed configuration of the illumination channels can be achieved. Different illumination settings result, which differ in the distribution of the illumination angles of the illumination light 10 over the object field 5.

In order to facilitate the explanation of positional relationships, use is made below of, interalia, a global Cartesian xyz-coordinate system. The x-axis runs perpendicular to the plane of the drawing towards the observer in FIG. 1. The y-axis runs towards the right in FIG. 1. The z-axis runs upwards in FIG. 1.

In selected figures from among the subsequent figures, a local Cartesian xyz-coordinate system is depicted, wherein the x-axis runs parallel to the x-axis according to FIG. 1 and the y-axis together with the x-axis spans the optical area of the respective optical element.

Different illumination systems can be achieved via a tilting of the individual mirrors of the field facet mirror 13 and a corresponding change in the assignment of the individual mirrors of the field facet mirror 13 to the individual mirrors of the pupil facet mirror 14. Depending on the tilting of the individual mirrors of the field facet mirror 13, the individual mirrors of the pupil facet mirror 14 that are newly assigned to the individual mirrors are tracked by tilting such that an imaging of the field facets of the field facet mirror 13 into the object field 5 is once again ensured.

FIG. 2 shows an alternative configuration of an illumination optical unit 24 for the projection exposure apparatus 1. Components corresponding to those which have already been explained above with reference to FIG. 1 bear the same reference numerals and will not be discussed in detail again.

Used radiation 10 emerging from the radiation source 3, which can likewise be embodied as an LPP source, is firstly collected by a first collector 25. The collector 25 can be a parabolic mirror which images the radiation source 3 into the intermediate focal plane 12 or focuses the light from the radiation source 3 onto the intermediate focus in the intermediate focal plane 12. The collector 25 can be operated in such a way that the used radiation 10 impinges on it at angles of incidence near 0°. The collector 25 is then operated near normal incidence and is therefore also referred to as a normal incidence (NI) mirror. A collector operated with grazing incidence can also be used instead of the collector 25.

In the case of the illumination optical unit 24, a field facet mirror 26 in the form of a multi- or micromirror array (MMA) as an example of an optical assembly for guiding the used radiation 10, that is to say the EUV radiation beam, is disposed downstream of the intermediate focal plane 12. The field facet mirror 26 is embodied as a microelectromechanical system (MEMS). It has a multiplicity of individual mirrors 27 arranged in a matrixlike manner in rows and columns in an array. The individual mirrors 27 are designed to be tiltable by an actuator system, as will be explained below. Overall, the field facet mirror 26 has approximately 100 000 of the individual mirrors 27. Depending on the size of the individual mirrors 27, the field facet mirror 26 can also have for example 1000, 5000, 7000 or else hundreds of thousands of individual mirrors 27, for example 500 000. The microelectromechanical system (MEMS) of the facet mirror 26 is also referred to as a microopticoelectromechanical system (MOEMS).

A spectral filter can be arranged upstream of the field facet mirror 26 and separates the used radiation 10 from other wavelength components of the emission of the radiation source 3 that are not usable for the projection exposure. The spectral filter is not illustrated.

The field facet mirror 26 is impinged on by used radiation 10 having a power of 840 W and a power density of 6.5 kW/m$^2$.

The entire individual mirror array of the facet mirror 26 has a diameter of 500 mm and is designed in a close packed manner with the individual mirrors 27. In so far as a field facet is represented by exactly one individual mirror in each case, the individual mirrors 27 represent the shape of the object field 5, apart from the scaling factor. The facet mirror 26 can be formed from 500 individual mirrors 27 each representing a field facet and having a dimension of approximately 5 mm in the y-direction and 100 mm in the x-direction. As an alternative to the realization of each field facet by exactly one individual mirror 27, each of the field facets can be approximated by groups of smaller individual mirrors 27. A field facet having dimensions of 5 mm in the y-direction and of 100 mm in the x-direction can be constructed e.g. via a 1×20 array of individual mirrors 27 having dimensions of 5 mm×5 mm through to a 10×200 array of individual mirrors 27 having dimensions of 0.5 mm×0.5 mm. The area coverage of the complete field facet array by the individual mirrors 27 can be 70% to 80%.

The used light 10 is reflected by the individual mirrors 27 of the facet mirror 26 towards a pupil facet mirror 28. The pupil facet mirror 28 has approximately 2000 static pupil facets 29. The latter are arranged alongside one another in a plurality of concentric rings, such that the pupil facet 29 of the innermost ring is fashioned in a sector-shaped manner and the pupil facets 29 of the rings directly adjacent thereto are fashioned in a ring-sector-shaped manner. In a quadrant of the pupil facet mirror 28, 12 pupil facets 29 can be present alongside one another in each of the rings. Each of the ring sectors illustrated in FIG. 3 is in turn formed by a plurality of individual mirrors 27.

The used light 10 is reflected by the pupil facets 29 towards a reflected reticle 30 arranged in the object plane 6. The projection optical unit 7 then follows, as explained above in connection with the projection exposure apparatus according to FIG. 1.

A transfer optical unit can once again be provided between the facet mirror 28 and the reticle 30, as explained above in connection with the illumination optical unit 4 according to FIG. 1.

With the aid of the projection exposure apparatus 1, at least one part of the reticle 30 is imaged onto a region of a light-sensitive layer on the wafer for the lithographic production of a micro- or nanostructured component, in particular of a semiconductor component, e.g. of a microchip. Depending on the embodiment of the projection exposure apparatus 1 as a scanner or as a stepper, the reticle 30 and the wafer are moved in a temporally synchronized manner in the y-direction continuously in scanner operation or step by step in stepper operation.

FIG. 3 shows by way of example an illumination of the pupil facets 29 of the pupil facet mirror 28 by which a conventional illumination setting can approximately be achieved. In the two inner pupil facet rings of the pupil facet mirror 28, every second one of the pupil facets 29 is illuminated in the circumferential direction. This alternating illumination representation in FIG. 3 is intended to symbolize that the filling density realized in the case of this illumination setting is lower than in the case of an annular illumination setting by a factor of 2. A homogeneous illumination distribution is likewise striven for in the two inner pupil facet rings, although with an occupation density that is lower by a factor of 2. The two outer pupil facet rings illustrated in FIG. 3 are not illuminated.

The individual mirrors 27 of the field facet mirror 26 and the correspondingly constructed individual mirrors of the field facet mirror 13 and of the pupil facet mirror 14 in the embodiment of the illumination optical unit 4 according to FIG. 1 bear multilayer coatings for optimizing their reflectivity at the wavelength of the used radiation 10. The temperature of the multilayer coatings should not exceed 425 K during the operation of the projection exposure apparatus 1.

The individual mirrors 27 of the illumination optical unit 4 and 24 are accommodated in an evacuatable chamber 32, a boundary wall 33 of which is indicated in FIG. 2. The chamber 32 communicates with a vacuum pump 33$c$ via a fluid line 33$a$, in which a shutoff valve 33$b$ is accommodated. The operating pressure in the evacuatable chamber 32 is a few pascals, in particular 3 Pa to 5 Pa (partial pressure H$_2$). All other partial pressures are significantly below 1×10$^{-7}$ mbar.

Each of the individual mirrors 27 can have an impingeable reflection surface 34 having dimensions of 0.1 mm×0.1 mm, 0.5 mm×0.5 mm or else of 5 mm×5 mm or larger. The reflection surface 34 is formed by the multilayer coating.

The reflection surfaces 34 of the individual mirrors 27 complement one another to form an entire mirror reflection surface of the field facet mirror 26. Correspondingly, the reflection surfaces 34 can also complement one another to form the entire mirror reflection surface of the field facet mirror 13 or of the pupil facet mirror 14.

The embodiment of an optical component, in particular in the form of a blockade filter 36 for blocking part of the used radiation 10, is described below with reference to FIG. 4. The blockade filter 36 forms, in particular, an obscuration of the beam path of the projection exposure apparatus 1.

The blockade filter 36 can be arranged in particular in the beam path between the intermediate focal plane 12 and the field facet mirror 13 or 26 or in the beam path between the field facet mirror 13 or 26 and pupil facet mirror 14 or 28. Schematic FIG. 4 generally illustrates the arrangement of the blockade filter 36 in the beam path upstream of a micromirror array 37 having a multiplicity of micromirrors 39. For details of the micromirror array 37, reference should be made to the description above.

Figure 4:
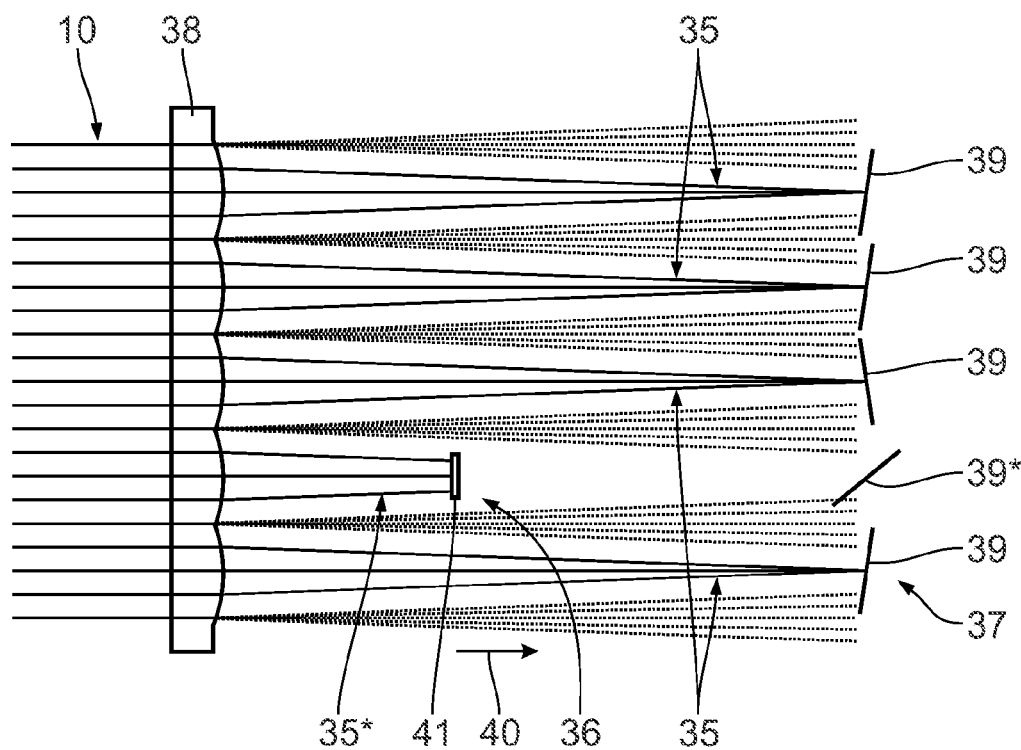
FIG. 4 schematically shows a view of an excerpt from the beam path of the projection exposure apparatus in which a light ray is blocked by an obscuration element.

In addition, FIG. 4 schematically illustrates a focusing array 38. The focusing array 38 can also be dispensed with. It can also be formed by a reflective element, in particular a facet mirror or a collector, particularly in the case of an EUV projection exposure apparatus.

As is illustrated by way of example in FIG. 4, the micromirror array 37 includes a defective micromirror 39*.

A defect of one of the mirrors 39 can consist, for example, in the fact that this mirror can no longer be tilted in a controlled manner. This can have the effect that the used radiation 10 is deflected in an incorrect direction. In the case where each of the micromirrors 39 is illuminated by a dedicated light source 3, the deflection of the used radiation 10 in an incorrect direction can be prevented by the light source associated with the defective mirror 39* being switched off. In the case of a common radiation source 3, the radiation 10 of which is split into a multiplicity of beams 35 by a suitable optical component, for example a facet mirror, the disclosure provides for blocking out the beam 35* associated with the defective micromirror 39* via the blockade filter 36.

For this purpose, the blockade filter 36 has an obscuration element 41 extending transversely with respect to the direction 40 of propagation of the used radiation 10. The construction of the blockade filter 36, in particular of the constituent parts thereof, will be described in even greater detail below.

Figure 5:
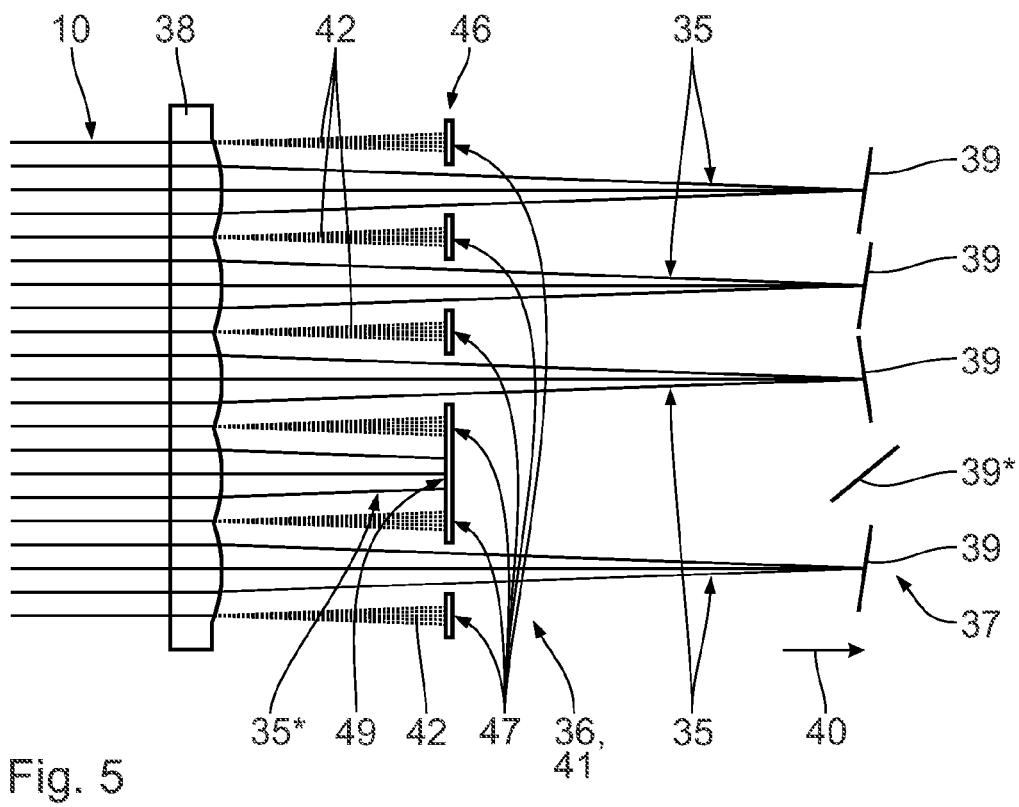
FIG. 5 shows a view in accordance with FIG. 4 with a plurality of obscuration elements in the beam path, FIG. 6a schematically shows a view of a carrying structure for the arrangement of obscuration elements, the carrying structure being arranged in a frame.

In the exemplary embodiment illustrated in FIG. 5, the blockade filter 36 includes a plurality of obscuration elements 41. The obscuration elements 41 can be embodied, firstly, by grating webs 47 of a grating 46, which will be described in even greater detail below. They can also be formed by filled meshes 49 of the grating 46. In this regard, it should be pointed out that it is possible, for producing the grating, to cut out the radiation-transmissive regions from a substrate, for example a metal sheet or film. In principle, it is also conceivable to provide a netlike substrate and then to fill the meshes 49 which are intended to serve as obscuration elements 41.

The grating webs 47 form in particular obscuration elements 41 for the obscuration of stray light 42 and/or extraneous light. The filled meshes 49 form in particular obscuration element 41 for the obscuration of the used radiation 10. In other words, the obscuration elements 41 can serve not only for blocking a beam 35* assigned to a defective micromirror 39*, but also for stopping down, i.e. blocking, stray light 42.

In the exemplary embodiment illustrated in FIG. 5, the grating 46 is embodied as a self-supporting structure. In principle, it is also possible to arrange the grating on a carrier, in particular composed of a material transparent to the used radiation 10.

The construction of the blockade filter 36 is described in greater detail below with reference to FIGS. 6 and 7.

The blockade filter 36 is generally an optical component including a frame 43. The frame 43 serves for the arrangement, in particular the fixing, of the obscuration elements 41 and/or the carrying structure thereof. The obscuration elements 41 are generally constituent parts of an optical element 45 extending transversely with respect to the direction 40 of propagation. The frame 43 thus serves for mounting at least one optical element 45. The obscuration elements 41 extend transversely with respect to the direction 40 of propagation of the used radiation 10. Independently of the beam path in the projection exposure apparatus, the direction corresponding to the direction 40 of propagation is also referred to as first direction. The plane perpendicular to the direction 40 of propagation is referred to hereinafter as transverse plane, which is spanned by two transverse directions $44_1$ and $44_2$. Hereinafter, mention is also generally made of a transverse direction 44, oriented perpendicular to the direction 40 of propagation.

The obscuration elements 41 can be fixed directly on or in the frame 43.

The optical element 45 is freely accessible in the direction 40 of propagation in a central region. In particular the region surrounded by the frame 43 is designated as central region. The optical element 45 is arranged in the frame 43 in particular in such a way that it can be displaced in the direction 40 of propagation in the central region. It can in particular bulge or bend out in the central region.

The optical element 45 is fixed by the frame 43 in an edge region. It is fixed by the frame 43 in particular in a circumferentially extending, preferably a closed, edge region. Generally, the optical element 45 is fixed by the frame 43 in a direction perpendicular to the direction 40 of propagation, in particular in the transverse direction 44, at at least two locations situated opposite one another in the transverse plane.

The optical element 45 can be embodied as a membrane; it has a thickness of at most 1 mm, in particular at most 500 µm, in particular at most 200 µm, in particular at most 100 µm, in particular at most 50 µm, in particular at most 20 µm, in particular at most 10 µm, in particular at most 1 µm, in particular at most 100 nm, in particular at most 10 nm, in particular at most 5 nm. It can also be embodied in a membranelike fashion. A membranelike embodiment should be understood here to mean that the optical element 45 has a thickness which is small in relation to its extent, in particular its maximum extent, in the transverse plane. The ratio of thickness to a maximum extent in the transverse direction of the optical element 45 is in particular at most 1:100, in particular at most 1:1000, in particular at most $1:10^4$, in particular at most $1:10^5$, in particular at most $1:10^6$, in particular at most $1:10^7$, in particular at most $1:10^8$.

The optical element 45 can also be embodied as a plate or in a platelike fashion. It can be embodied in a self-supporting fashion. It can also include a carrier or be applied to a carrier.

In FIG. 6, the carrier is embodied as a grating 46 by way of example. The grating 46 is a metal grating, semiconductor grating or ceramic grating. The grating 46 includes grating webs 47, which are preferably made very narrow. The grating webs 47 have in particular a width in the range of 1 µm to 100 µm, in particular in the range of 3 µm to 30 µm, in particular in the range of 5 µm to 20 µm. The grating 46 has a thickness in the direction 40 of propagation which is at most 1 mm, in particular at most 500 µm, in particular at most 200 µm, in particular at most 100 µm, in particular at most 50 µm, in particular at most 20 µm, in particular at most 10 µm, in particular at most 1 µm, in particular at most 100 nm, in particular at most 10 nm, in particular at most 5 nm. The grating 46 behaves in a membranelike fashion, in particular in a flexible fashion, as a result. The grating 46, in particular the grating webs 47, can also itself/themselves form obscuration elements 41, in particular for the obscuration of stray light and/or extraneous light (see FIG. 5). In other words, the grating 46 can itself be part of the obscuration element 41.

Instead of a grating 46, a glass plate, in particular a structured glass plate, can also serve as the carrier. Generally, the carrier has regions which are radiation-transmissive to the used radiation 10. The carrier can be embodied as radiation-transmissive to the used radiation 10, in particular. In this case, radiation-transmissive should be understood to mean a transmittivity of at least 50%, in particular at least 70%, in particular at least 90%, preferably at least 99%. The obscuration elements 41 form radiation-nontransmissive regions. In this case, radiation-nontransmissive should be understood to mean a transmittivity of less than 50%, in particular less than 30%, in particular less than 10%, in particular less than 1%, in particular less than 0.1%, in particular less than 0.01%.

In the case of grating 46, the radiation-nontransmissive regions can be formed by the filled meshes 49. The radiation-transmissive regions can be formed by the open grating meshes, i.e. by cutouts in the grating 46.

The optical element 45 is held stably by the frame 43 in the transverse plane in particular in a circumferentially extending region. Via the frame 43, the optical element 45 is fixed at least regionally, in particular marginally, in particular in the transverse direction 44, that is to say in the direction perpendicular to the direction 40 of propagation.

Figure 6A:
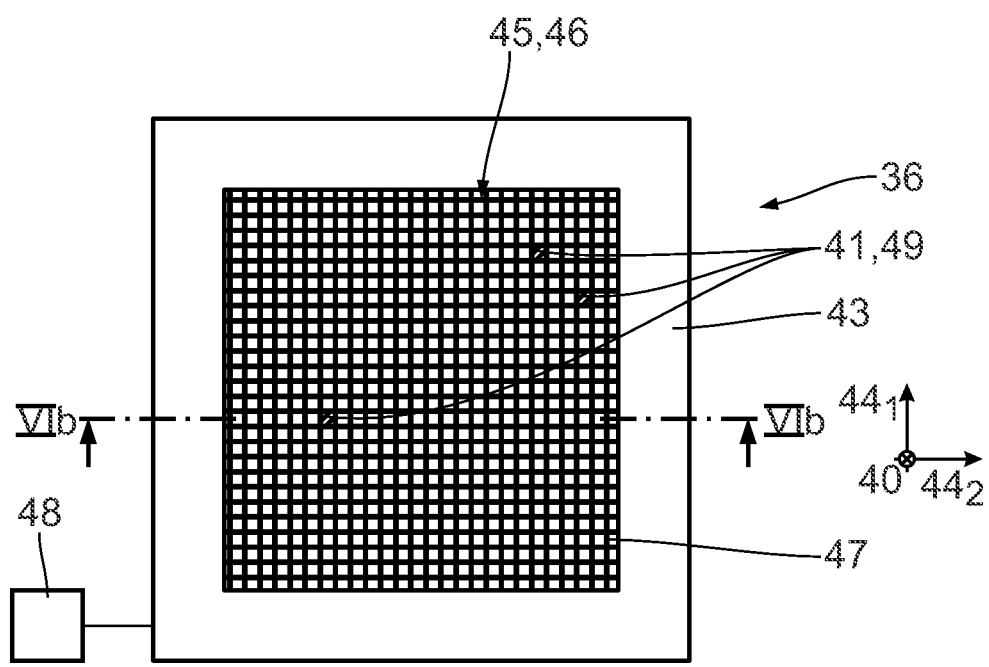
FIG. 6b shows a cross section along the line VIb of the optical component in accordance with FIG. 6a, FIG. 7a shows a view in accordance with FIG. 6 with a multiplicity of obscuration elements arranged on the carrying structure.
Figure 6B:
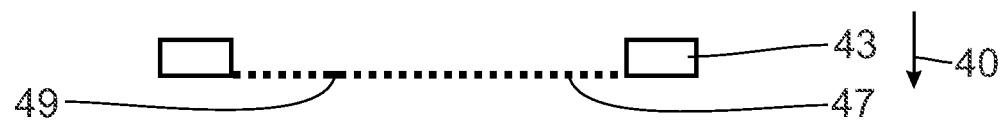

In the exemplary embodiment illustrated in FIGS. 6a and 6b, the grating 46 is arranged directly on or in the frame 43. The totality of the radiation-transmissive regions thus extends over the entire region bounded circumferentially by the frame 43.

Figure 7A:
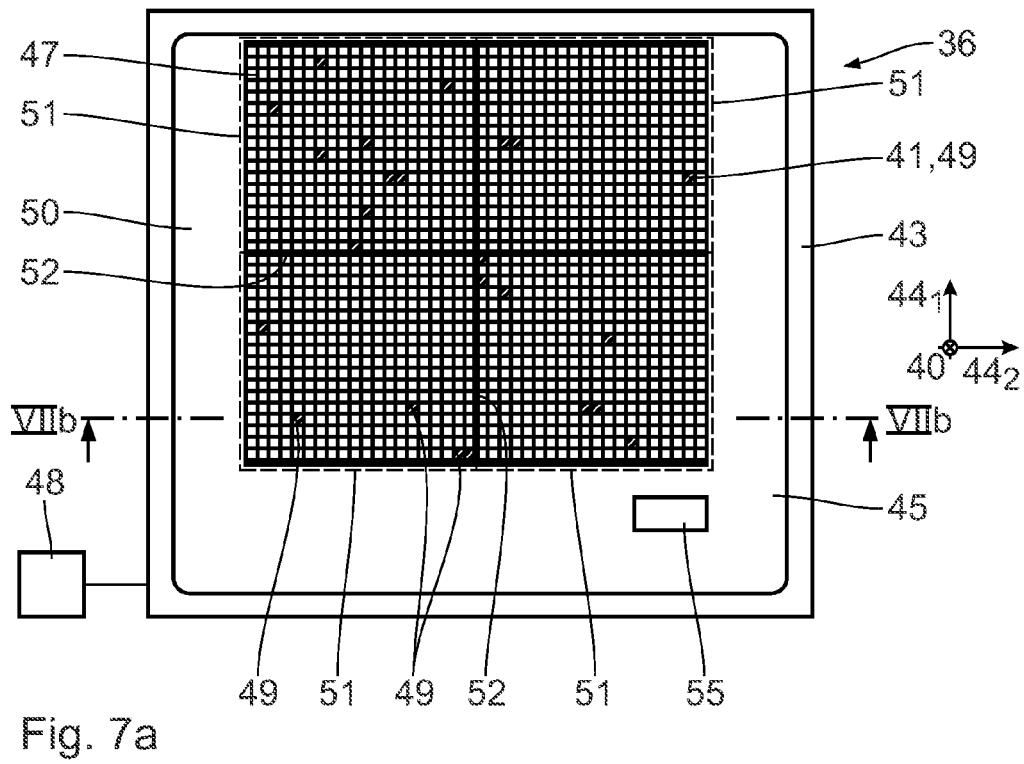
FIG. 7b shows a cross section along the line VIIb of the optical component in accordance with FIG. 7a, and FIGS. 8a and 8b show schematic diagrams for elucidating the effect which a thermal expansion of the carrying structure with the obscuration elements has on the positioning thereof.
Figure 7B:
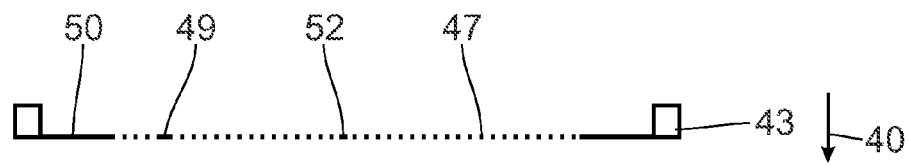

In the exemplary embodiment illustrated in FIGS. 7a and 7b, the grating 46 includes marginally a region 50 embodied in a closed fashion, i.e. in a radiation-nontransmissive fashion. In other words, the region 50 has no open grating meshes. The region 50 is also designated as part of the grating 46. The region 50 can be embodied in a membrane-like fashion like the rest of the grating 46. It can be embodied in particular like the rest of the grating 46, apart from the radiation nontransmissivity. An ID number 55 for identifying the filter 36 can be fitted on the region 50.

In addition, FIG. 7a schematically indicates that the grating 46 includes four partial regions 51 separated from one another in each case by a radiation-nontransmissive region 52. Apart from its extent in the transverse direction, the radiation-nontransmissive region 52 can be embodied like the grating webs 47. It can contribute to the mechanical stabilization of the grating 46. It can contribute in particular to the mechanical stabilization of the grating 46 in the frame 43. It can also be embodied in a framelike fashion. It can have larger dimensions, that is to say a larger thickness, than the grating webs 47 in particular in the direction 40 of propagation. The thickness of the radiation-nontransmissive region 52 can be in particular at least double the magnitude, in particular at least three times the magnitude, in particular at least five times the magnitude, of that of the grating webs 47. The radiation-nontransmissive region 52 can be embodied in a strip-shaped fashion, in particular in a crucible fashion. It can also include a plurality of strips and be embodied in a grid-shaped fashion.

The individual partial regions 51 can be assigned to separate micromirror arrays 37 embodied in a modulelike fashion.

The frame 43 is embodied in particular in a circumferentially enclosed fashion. The optical element 45 is clamped into the frame 43 marginally. It is fixed in particular on or in the frame 43. The fixing is preferably designed in such a way that transverse slipping of the optical element 45, in particular of the grating 46, cannot occur. The fixing can include a magnetic mechanism, for example.

It is possible, in particular, to arrange permanent magnets in the frame 43, with the aid of which permanent magnets a ferromagnetic grating can be fixed. The magnets are arranged in particular in such a way that their magnetization is aligned perpendicular to the grating 46.

In a further embodiment, the grating 46 and the frame 43 are composed of an electrically conductive material. The grating 46 and the frame 43 are separated from one another in this case by a thin insulation layer. For the purpose of fixing the grating 46, an electrical voltage is applied between the grating 46 and the frame 43. The fixing is thus effected by electrostatic forces. In this case, too, the fixing forces are aligned perpendicular to the transverse plane.

In an alternative embodiment, the optical element 45 is mechanically clamped in the frame 43. This prevents, in particular, a torque from acting on the optical element 45, in particular the grating 46. This can be achieved, for example, by clamping springs for fixing the optical element 45 being embodied in such a way that they do not concomitantly turn during the tightening of clamping screws and thus exclusively exert a force perpendicular to the surface.

Preferably, the fixing of the optical element 45 in the frame 43 is reversible. The optical element 45 is arranged in the frame 43 in particular in an exchangeable manner. However, it is also possible to adhesively bond the optical element 45 in the frame 43.

The frame 43 is embodied in a mechanically stable manner relative to the optical element 45. It has in particular in the direction 40 of propagation a thickness which is at least 10 times, in particular at least 100 times, in particular at least 1000 times, the magnitude of that of the optical element 45.

The frame 43 can preferably be embodied in a profiled fashion. Its stiffness can be further improved, in particular set locally in a targeted manner, as a result. Moreover, in this way it is possible to reduce the material for the frame and thereby to optimize the costs and weight.

The frame 43 can have the same stiffness everywhere. However, it can also have a stiffness that varies across its dimensions. It is possible, in particular for the frame 43 to be embodied differently in the region of the corners compared with the centre region of the side edges.

The frame 43 is preferably thermally coupled to a cooling device 48, which is only illustrated schematically in the figures. This makes it possible to keep the temperature of the frame 43 constant at least as much as possible. The cooling device 48 can include a control circuit for this purpose. The thermal coupling to the cooling device 48 can be produced via a solid-state connection or via a gas interface or liquid interface. The cooling device 48 can also be embodied as a simple cold reservoir or as a heat sink.

The frame 43 has in particular dimensions that are large enough to ensure that temperature gradients within the frame 43 are negligibly small.

The frame 43 has in particular a heat capacity which is at least 10 times, in particular at least 100 times, the magnitude of that of the optical element 45.

Preferably, the frame 43 is composed of one or a plurality of materials having a thermal conductivity of at least 100 W/(mK), in particular at least 200 W/(mK), in particular at least 300 W/(mK). These indications relate to a temperature of 0° C. The frame 43 can consist in particular of one or a plurality of such materials. In particular copper, aluminum, diamond or silicon carbide are suitable as materials for the frame 43.

Moreover, the frame 43 is so stable that it cannot warp as a result of thermal stresses of the optical element 45. The frame 43 is embodied in particular in such a way that it has a linear expansion of at most 0.01%, in particular at most 0.001%, in particular at most 0.0001% in the transverse direction 44 even in the case of a linear expansion of the optical element 45 in the transverse direction 44 by up to 1%. The frame 43 is embodied in particular in such a way that the edge of the optical element 45 which is fixed on or in the frame 43 remains fixed even under thermal load.

The fixing of the optical element 45 in the transverse direction 44 by the stable frame 43 reduces the maximum possible shift, in particular of the obscuration elements 41 in the transverse direction 44. Consequently, the temperature influence on the transmission loss and the increase in extraneous light can be reduced.

Preferably, the frame 43 has a low thermal expansion. It is composed, in particular, of one or a plurality of materials having a low coefficient of linear expansion. Preferably, the optical element 45 is also composed of a material having a low coefficient of linear expansion.

The functioning of the optical element 45 arranged in the frame 43 is explained below with reference to FIGS. 8*a* and 8*b*. In the cold state, i.e. at room temperature, 20° C., the grating 46 with the obscuration elements 41 is clamped in the frame 43 marginally in a plane fashion (see FIG. 8*a*). If the grating 46, in particular the obscuration element 41, is guided into the beam path of the used radiation 10, it can heat up on account of the absorption of the used radiation 10. Heating of the optical element 45 leads to a thermal expansion. However, since the optical element 45 cannot expand freely owing to the frame 43, a mechanical stress builds up on account of the thermal expansion of the filter material. Starting from a critical temperature, the stress becomes so high that the optical element 45 bulges in the direction 40 of propagation or in the opposite direction. It is also possible to predefine defined predetermined bending locations which result in the optical element 45 bending out at these defined locations. The bulging or the bending-out of the optical element 45 in the direction 40 of propagation or in the opposite direction thereto results in a reduction of a shift of the obscuration elements 41 in the direction perpendicular to the direction 40 of propagation, in particular in the transverse direction 44. The obscuration elements 41 thus remain fixed to the greatest possible extent in the direction perpendicular to the direction 40 of propagation.

Figure 8A:
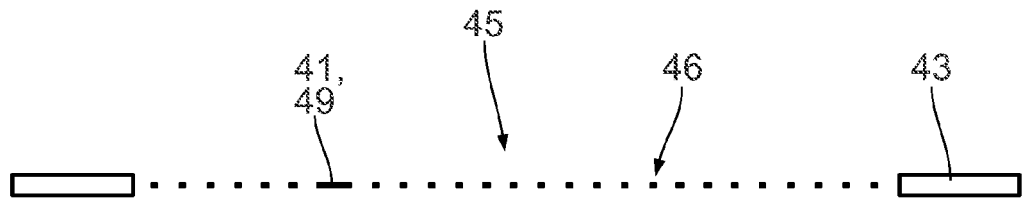
Figure 8B:
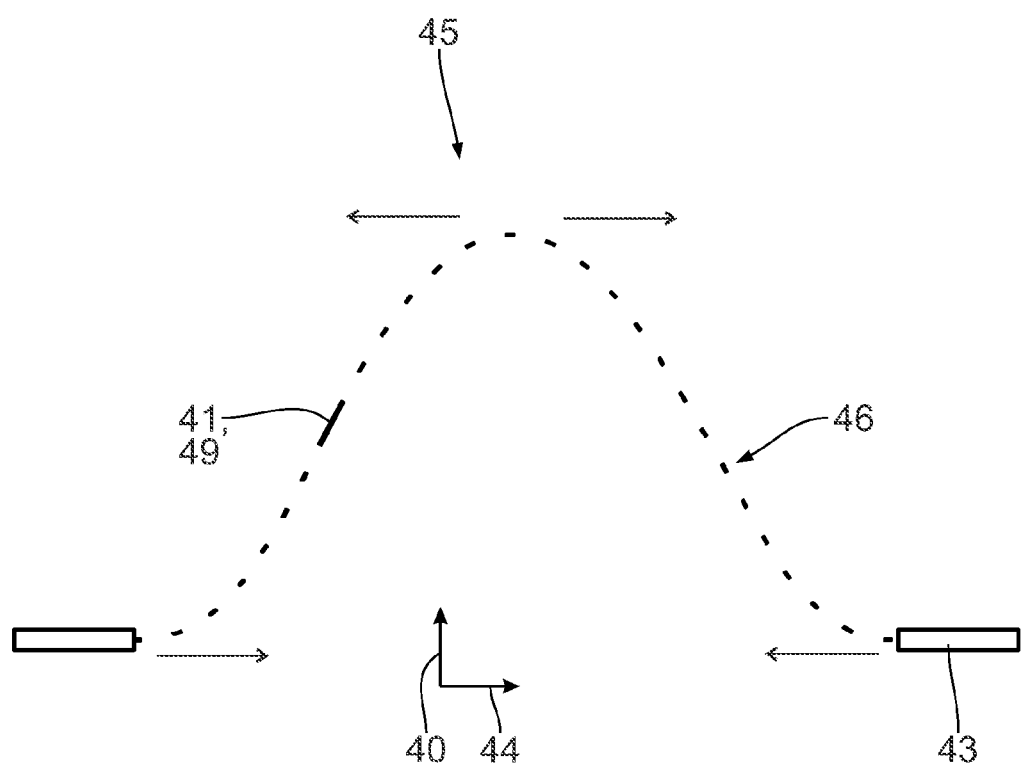

It was possible to show that the positioning of the obscuration elements 41 in the transverse direction remained substantially unchanged as long as the optical element 45 maintains the plane state illustrated in FIG. 8*a*. It was furthermore possible to show that the maximum shift of the obscuration elements 41 in the transverse direction 44, as a result of the fixing of the optical element 45 in the frame 43 and bulging of the optical element 45 in the direction 40 of propagation or in the opposite direction, could be reduced by more than 50%, in particular by more than 60%, in particular by more than 70%, in comparison with an optical element 45 clamped in on one side.

In the exemplary embodiments described above, the optical element 45 was part of a blockade filter 36. However, the disclosure is generally useful for optical elements which consist of or include a membrane or a plate that can be bent out, in order to reduce the maximum local shift in the direction perpendicular to the direction 40 of propagation. The optical element 45 can include in particular a phase or amplitude, that is to say intensity filter or be embodied as such. The optical element 45 can also include a spectral filter or be embodied as such.

The optical component including the frame 43 and the optical element 45 can advantageously be combined with the micromirror array 37 to form an optical assembly. It can be combined in particular with a facet mirror to form an optical assembly. Preferably, in this case, each of the radiation-nontransmissive obscuration elements 41 is assigned to exactly one micromirror 39 of the micromirror array 37. However, it is also possible to assign one or a plurality of the obscuration elements 41 in each case to two or more micromirrors 39 arranged adjacent to one another.

The optical component is arranged with the aid of a mounting frame in an optical system, in particular the illumination optical unit 4 of the projection exposure apparatus 1. The optical component can be arranged in particular in the beam path between the field facet mirror 13 and the pupil facet mirror 14. In principle, it can also be arranged in the beam path between the radiation source 3 and the field facet mirror 13, in particular between the intermediate focal plane 12 and the field facet mirror 13, or between the pupil facet mirror 14 and the object field 5. It is also possible to arrange a plurality of such components in the illumination optical unit 4 of the projection exposure apparatus 1.

What is claimed is:

1. An optical component, comprising:
   an optical element; and
   a frame,
   wherein:
      the optical element is mounted to the frame;
      the optical element extends perpendicular to a first direction;
      a central region of the optical element is freely accessible along the first direction;
      relative a second direction which is perpendicular to the first direction, a first location of the optical element is opposite a second location of the optical element;
      the optical element is fixed to the frame at the first and second locations of the optical element;
      the optical component is configured so that:
         when the optical element expands linearly in the second direction by up to 1%, the frame expands linearly in the second direction by at most 0.01%; and
      one of the following holds:
         the optical element is arranged in the frame so that, when the optical element expands linearly, the optical elements bulges or bends out; and
         the optical element is arranged on the frame so that, when the optical element expands linearly, the optical elements bulges or bends out.

2. The optical element of claim 1, wherein the optical element comprises a membrane.

3. The optical element of claim 1, wherein the optical element comprises a phase filter.

4. The optical element of claim 1, wherein the optical element comprises an intensity filter.

5. The optical element of claim 1, wherein the optical element comprises:
   a carrier having radiation-transmissive regions; and
   radiation-nontransmissive regions supported by the radiation-transmissive carrier.

6. The optical element of claim 5, wherein the optical element comprises a grating, and the grating comprises webs having a width in the range of one micrometer to 100 micrometers.

7. The optical element of claim 1, wherein the optical element comprises a grating, and the grating comprises webs having a width in the range of one micrometer to 100 micrometers.

8. The optical element of claim 7, wherein a thickness of the grating in the first direction is at most 50 micrometers.

9. The optical element of claim 7, wherein a thickness of the grating in the first direction is at most 50 micrometers.

10. The optical element of claim 1, wherein a thickness of the frame along the first direction is at least ten times a thickness of the optical element along the first direction.

11. The optical element of claim 1, further comprising a cooling device, wherein the frame is thermally coupled to a cooling device.

12. The optical element of claim 1, wherein the frame has a heat capacity that is at least ten times a heat capacity of the optical element.

13. The optical element of claim 1, wherein the frame comprises a material having a thermal conductivity of at least 100 W/(m K).

14. An optical assembly, comprising:
a micromirror array comprising a multiplicity of micromirrors; and
an optical component according to claim 1.

15. The optical assembly of claim 14, wherein:
the optical element comprises:
a carrier having radiation-transmissive regions; and
radiation-nontransmissive regions supported by the radiation-transmissive carrier; and
for each of the radiation-nontransmissive regions, the radiation-nontransmissive region is assigned to at least one micromirror.

16. An illumination optical unit, comprising:
an optical assembly, comprising:
a micromirror array comprising a multiplicity of micromirrors; and
an optical component according to claim 1.

17. The illumination optical unit of claim 16, wherein:
the optical element comprises:
a carrier having radiation-transmissive regions; and
radiation-nontransmissive regions supported by the radiation-transmissive carrier; and
for each of the radiation-nontransmissive regions, the radiation-nontransmissive region is assigned to at least one micromirror.

18. An apparatus, comprising:
an illumination optical unit, comprising:
an optical assembly, comprising:
a micromirror array comprising a multiplicity of micromirrors; and
an optical component according to claim 1; and
a projection optical unit.

19. The apparatus of claim 18, wherein:
the optical element comprises:
a carrier having radiation-transmissive regions; and
radiation-nontransmissive regions supported by the radiation-transmissive carrier; and
for each of the radiation-nontransmissive regions, the radiation-nontransmissive region is assigned to at least one micromirror.

20. A method of using a microlithography projection exposure apparatus comprising an illumination optical unit a projection optical unit, the method comprising:
using the illumination optical unit to illuminate at least some structures of a reticle; and
using the projection optical unit to project at least a part of the illuminated reticle onto a light-sensitive material, wherein the illumination optical unit comprises:
an optical assembly, comprising:
a micromirror array comprising a multiplicity of micromirrors; and
an optical component according to claim 1.

21. An optical component, comprising:
an optical element; and
a frame,
wherein:
the optical element is mounted to the frame;
the optical element extends perpendicular to a first direction;
a central region of the optical element is freely accessible along the first direction;
the optical element has first and second locations;
the optical element is fixed to the frame at the first and second locations of the optical element;
the optical component is configured so that, when the optical element expands linearly in the second direction by up to 1%, the frame expands linearly in the second direction by at most 0.01%; and
one of the following holds:
the optical element is arranged in the frame so that, when the optical element expands linearly, the optical elements bulges or bends out; and
the optical element is arranged on the frame so that, when the optical element expands linearly, the optical elements bulges or bends out.

22. An optical component, comprising:
an optical element; and
a frame,
wherein:
the optical element is mounted to the frame at two locations so that the optical element is displaceable in a first direction;
a central region of the optical element is freely accessible along the first direction;
the optical component is configured so that, when the optical element expands linearly in the second direction by up to 1%, the frame expands linearly in the transverse direction by at most 0.01%; and
one of the following holds:
the optical element is arranged in the frame so that, when the optical element expands linearly, the optical elements bulges or bends out; and
the optical element is arranged on the frame so that, when the optical element expands linearly, the optical elements bulges or bends out.

* * * * *